(12) United States Patent  (10) Patent No.: US 9,035,553 B2
Choi  (45) Date of Patent: May 19, 2015

(54) HYBRID PLASMA REACTOR

(71) Applicant: Dae-Kyu Choi, Gyeonggi-do (KR)

(72) Inventor: Dae-Kyu Choi, Gyeonggi-do (KR)

(73) Assignee: Dae-Kyu Choi, Gyeonggi-do (KR)

( * ) Notice: Subject to any disclaimer, the term of this patent is extended or adjusted under 35 U.S.C. 154(b) by 23 days.

(21) Appl. No.: 13/673,513

(22) Filed: Nov. 9, 2012

(65) Prior Publication Data

US 2013/0307414 A1 Nov. 21, 2013

(30) Foreign Application Priority Data

Nov. 9, 2011 (KR) .................. 10-2011-0116138
Nov. 10, 2011 (KR) .................. 10-2011-0117240
Dec. 27, 2011 (KR) .................. 10-2011-0143294
Dec. 27, 2011 (KR) .................. 10-2011-0143302

(51) Int. Cl.
*H01J 7/24* (2006.01)
*H01J 37/32* (2006.01)

(52) U.S. Cl.
CPC ......... *H01J 37/32816* (2013.01); *H01J 37/321* (2013.01)

(58) Field of Classification Search
USPC ..... 315/111.51, 111.21; 118/723 R, 723 AN; 156/345.38, 345.48
See application file for complete search history.

(56) References Cited

U.S. PATENT DOCUMENTS

| 6,211,622 | B1 * | 4/2001 | Ryoji et al. | 315/111.21 |
| 6,762,393 | B2 * | 7/2004 | Choi | 219/121.36 |
| 6,815,633 | B1 * | 11/2004 | Chen et al. | 219/121.54 |
| 6,855,906 | B2 * | 2/2005 | Brailove | 219/121.36 |
| 7,166,816 | B1 * | 1/2007 | Chen et al. | 219/121.41 |
| 7,429,532 | B2 * | 9/2008 | Ramaswamy et al. | 438/689 |
| 7,700,465 | B2 * | 4/2010 | Collins et al. | 438/513 |
| 7,837,826 | B2 * | 11/2010 | Marakhtanov et al. | 156/345.48 |
| 2009/0291027 | A1 * | 11/2009 | Choi | 422/105 |
| 2010/0206847 | A1 * | 8/2010 | Chen et al. | 216/67 |
| 2011/0177694 | A1 * | 7/2011 | Chen et al. | 438/710 |
| 2012/0212136 | A1 * | 8/2012 | Einav | 315/111.41 |

* cited by examiner

*Primary Examiner* — Douglas W Owens
*Assistant Examiner* — Srinivas Sathiraju
(74) *Attorney, Agent, or Firm* — IP & T Group LLP

(57) ABSTRACT

A hybrid plasma reactor includes a reactor body having a plasma discharge space, a gas inlet, and a gas outlet; a hybrid plasma source including an inductive antenna inductively coupled to plasma formed in the plasma discharge space and a primary winding coil transformer coupled to the plasma and wound in a magnetic core; and an alternating switching power supply for supplying plasma generation power to the inductive antenna and the primary winding coil. The hybrid plasma reactor induces a plasma discharge using the inductively coupled plasma source and the transformer coupled plasma source, so that it has a wide operational area from a low pressure area to a high pressure area.

16 Claims, 18 Drawing Sheets

(a) POTENTIAL DIFFERENCE DEPENDING ON POSITION OF INDUCTIVE ANTENNA (b) POTENTIAL DIFFERENCE DEPENDING ON POSITION OF REACTOR BODY (a) POTENTIAL DIFFERENCE BETWEEN BOTH ENDS OF PRIMARY WINDING COIL (b) POTENTIAL DIFFERENCE BETWEEN BOTH ENDS OF SECONDARY WINDING COIL

HYBRID PLASMA REACTOR

CROSS-REFERENCE TO RELATED APPLICATION

This application claims priority of Korean patent application numbers 10-2011-0116138 filed on Nov. 9, 2011, Korean patent application number 10-2011-0117240 filed on Nov. 10, 2011, Korean patent application number 10-2011-0143294 filed on Dec. 27, 2011, and Korean patent application number 10-2011-0143302 filed on Dec. 27, 2011. The disclosure of each of the foregoing applications is incorporated herein by reference in its entirety.

BACKGROUND

1. Technical Field

The present invention relates to a plasma reactor for generating activated gas containing ions, free-radical, atoms, and molecules by a plasma discharge and performing a plasma processing for a solid, powder, gas, etc. with the activated gas, and more particularly to a hybrid plasma reactor for complexly generating plasma by using an inductively coupled plasma source and a transformer coupled plasma source.

2. Background Art

A plasma discharge has been used for gas excitation for generating activated gas containing ions, free-radical, atoms and molecules. The activated gas is widely used in various fields, and is representatively used in various semiconductor manufacturing processes, such as etching, deposition, cleaning, and ashing.

Recently, a wafer or a Liquid Crystal Display (LCD) glass substrate for manufacturing a semiconductor device becomes larger. In this respect, there is a need of an easily extensible plasma source having a high capability for controlling of plasma ion energy and a capability for processing a large area. It is known that remotely using the plasma is very useful in the process of manufacturing the semiconductor using plasma. For example, the remote use of the plasma has been usefully used in a cleaning of a process chamber or an ashing process for a photoresist strip. However, since a volume of the process chamber increases according to the enlargement of a substrate to be processed, a plasma source capable of remotely and sufficiently supplying high-density activated gas has been demanded.

In the meantime, a remote plasma reactor (or remote plasma generator) uses a transformer coupled plasma source or an inductively coupled plasma source. The remote plasma reactor using the transformer coupled plasma source has a structure in which a magnetic core having a first winding coil is mounted a reactor body having a toroidal structure. The remote plasma reactor using the inductively coupled plasma source has a structured in which an inductively coupled antenna is mounted in a reactor body having a hollow tube structure.

Since the remote plasma reactor having the transformer coupled plasma source is operated in a relatively high-pressure atmosphere according to a characteristic thereof, it is difficult to ignite plasma or maintain the ignited plasma in a low-pressure atmosphere. The remote plasma reactor having the inductively coupled plasma source can be operated in a relatively low-pressure atmosphere according to a characteristic thereof, but supplied power should be increased such that remote plasma reactor having the inductively coupled plasma source can be operated in a high-pressure atmosphere, so in this case, the inside of the reactor body may be damaged due to ion bombardment.

Accordingly, a remote plasma reactor efficiently operating at a low pressure or a high pressure is required according to various demands in the semiconductor manufacturing process. However, the conventional remote plasma reactor employing one of the transformer coupled plasma source and the inductively coupled plasma source failed to appropriately respond to the demands.

SUMMARY OF INVENTION

Accordingly, an object of the present invention is to provide a hybrid plasma reactor in which an inductively coupled plasma source is mixed with a transformer coupled plasma source, to achieve a wide operation area from a low-pressure area to a high-pressure area.

Another object of the present invention is to provide a hybrid plasma reactor in which an inductively coupled plasma source is mixed with a transformer coupled plasma source, such that plasma is easily ignited and the ignited plasma is maintained in a low-pressure area and a large volume of plasma is generated without damage of the inside of the reactor in a high-pressure area.

Another object of the present invention is to provide a hybrid plasma reactor in which an inductively coupled plasma source is mixed with a transformer coupled plasma source, to be effectively operated with a single power supply.

Another object of the present invention is to provide a hybrid plasma reactor which has a structure in which an inductively coupled plasma source is mixed with a transformer coupled plasma source and can selectively drive one of the inductively coupled plasma source and the transformer coupled plasma source or complexly drive the inductively coupled plasma source and the transformer coupled plasma source.

In order to attain the above object, one aspect according to the preferable embodiments of the present invention provides a hybrid plasma reactor including: a reactor body having a plasma discharge space, a gas inlet, and a gas outlet; a hybrid plasma source including an inductive antenna inductively coupled to plasma formed in the plasma discharge space and a primary winding coil transformer coupled to the plasma and wound in a magnetic core; and an alternating switching power supply for supplying plasma generation power to the inductive antenna and the primary winding coil.

Preferably, the reactor body includes a dielectric window formed between the inductive antenna and the plasma discharge space.

Preferably, the hybrid plasma reactor includes a vacuum insulation member formed between the dielectric window and the reactor body.

Preferably, the plasma discharge space has a ring-shaped plasma discharge path by the reactor body and the dielectric window.

Preferably, the plasma is initially ignited through inductively coupled discharge by the inductive antenna.

Preferably, when the plasma discharge space is in a first pressure state, the plasma is maintained by plasma discharge inductively coupled by the inductive antenna, and when the plasma discharge space is in a second pressure state higher than the first pressure state, the plasma is maintained by the plasma discharge inductively coupled by the inductive antenna and plasma discharge transformer coupled by the primary winding coil.

Preferably, when the plasma discharge space is in a first pressure state, the plasma is maintained by plasma discharge inductively coupled by the inductive antenna, and when the plasma discharge space is in a second pressure state higher than the first pressure state, the plasma is maintained by plasma discharge transformer coupled by the primary winding coil.

Preferably, the inductive antenna and the primary winding coil are series connected to the alternating switching power supply.

Preferably, the inductive antenna and the primary winding coil are parallel connected to the alternating switching power supply.

Preferably, the reactor body is electrically ground connected.

Preferably, the hybrid plasma reactor further includes a switching circuit for selectively ground connecting the reactor body.

Preferably, the hybrid plasma source includes a secondary winding coil wound in the magnetic core and the inductive antenna includes two divided inductive antennas, and one antenna of the two divided inductive antennas is connected to one end of the secondary winding coil and another antenna is connected to an opposite end of the secondary winding coil.

Preferably, the hybrid plasma reactor includes a switching circuit for selectively ground connecting the two divided inductive antennas.

Preferably, the reactor body includes a dielectric window formed between the inductive antenna and the plasma discharge space and a discontinuous conductive tube ground connected to an area including the inductive antenna.

More preferably, the discontinuous conductive tube is formed between the inductive antenna and the plasma discharge space or between the dielectric window and the plasma discharge space.

Still more preferably, the hybrid plasma reactor includes a switching circuit for selectively ground connecting the discontinuous conductive tube.

Still more preferably, the inductive antenna is wound at the gas inlet.

Advantageous Effects of Invention

The hybrid plasma reactor according to the present invention induces a plasma discharge using the inductively coupled plasma source and the transformer coupled plasma source, so that it has a wide operational area from a low pressure area to a high pressure area. Further, the hybrid plasma reactor according to the present invention can easily generate and maintain the plasma ignition in a low pressure area by the inductively coupled plasma source and generate a large volume of plasma without damage of the inside of the reactor in a high pressure area by the transformer coupled plasma source. Furthermore, the hybrid plasma reactor according to the present invention can effectively operate the two plasma sources with a single power supply and selectively drive any one of the inductively coupled plasma source and the transformer coupled plasma source or complexly drive the inductively coupled plasma source and the transformer coupled plasma source in a combination structure of the inductively coupled plasma source and the transformer coupled plasma source.

BRIEF DESCRIPTION OF DRAWINGS

The above and other aspects, features and advantages of the present invention will be more apparent from the following detailed description taken in conjunction with the accompanying drawings, in which.

DETAILED DESCRIPTION

Figure 1:
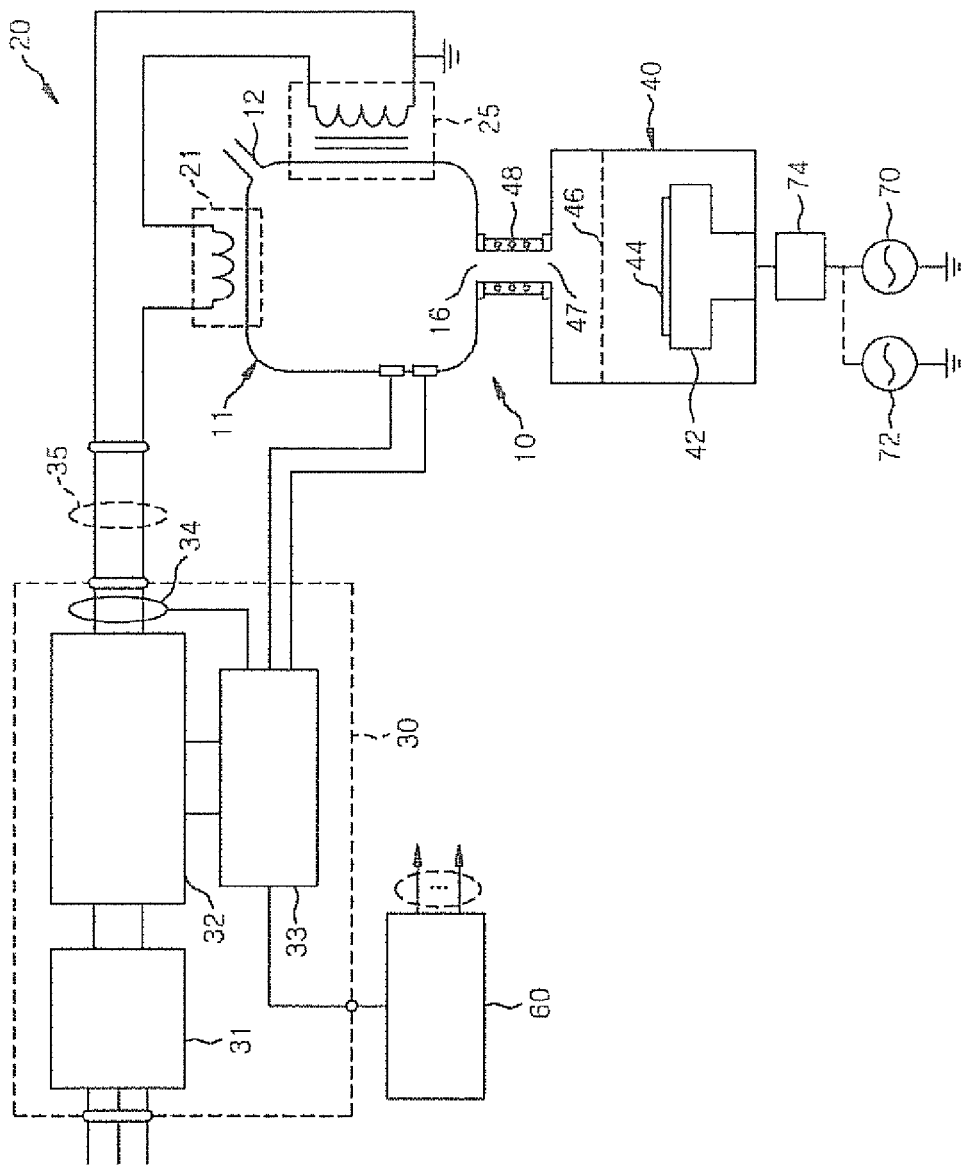
FIG. 1 is a block diagram illustrating a general construction of a hybrid plasma reactor and a plasma processing system including the hybrid plasma reactor according to the present invention.

Hereinafter, an exemplary embodiment of the present invention will be described in detail with reference to the accompanying drawings for the full understanding of the present invention. The embodiment of the present invention will be modified into various forms and it shall not be construed that the scope of the present invention is limited to the embodiment to be described below. The embodiment of the present invention is provided to more fully explain the present invention to a skilled person in the art. Accordingly, a shape, or the like of an element in the drawing may be exaggerated for more accurate description. Like reference numerals indicate like elements throughout the specification and drawings. In the following description, detailed explanation of known related functions and constitutions may be omitted to avoid unnecessarily obscuring the subject manner of the present invention.

FIG. 1 is a block diagram illustrating a general construction of a hybrid plasma reactor and a plasma processing system including the hybrid plasma reactor according to the present invention.

Referring to FIG. 1, a hybrid plasma reactor 10 (hereinafter, simply referred to as a plasma reactor) of the present invention is installed in an outside of a process chamber 40 and remotely supplies plasma to the process chamber 40. The plasma reactor 10 includes a hybrid plasma source 20. The hybrid plasma source 20 includes an inductive coupled plasma source inductively coupled to plasma generated in the plasma reactor 10 and a transformer coupled plasma source 25. The plasma reactor 10 complexly generates the inductively coupled plasma and the transformer coupled plasma by the hybrid plasma source 20, so that it is possible to stably generate the plasma under a wide range of a pressure condition from a low pressure of 1 torr or lower to a high pressure of 10 torr or higher. The plasma reactor 10 includes a reactor body 11 for providing a plasma discharge space. The reactor body 11 has a gas inlet 12 and a gas outlet 16. The gas outlet 16 is connected to a chamber gas inlet 47 of the process chamber 40 through an adapter 48. The plasma gas generated in the plasma reactor 10 is supplied to the process chamber 40 through the adapter 48.

The process chamber 40 includes a substrate supporter 42 for supporting a substrate 44 to be processed in the inside thereof. The substrate supporter 42 is electrically connected to one or more bias power supplies 70 and 72 through an impedance matching device 74. The adapter 48 may include an insulation section for electrical insulation and a cooling channel for preventing overheating. The process chamber 40 includes a baffle 46 for distributing plasma gas between the substrate supporter 42 and the chamber gas inlet 47 in the inside thereof. The baffle 46 allows the plasma gas introduced through the chamber gas inlet 47 to be evenly distributed and diffused to the substrate 44 to be processed. For example, the substrate 44 to be processed is a silicon wafer substrate for manufacturing a semiconductor device or a glass substrate for manufacturing an LCD or a plasma display.

The hybrid plasma source 20 is operated through receiving a wireless frequency from a power supply 30. The power supply 30 includes an AC switching power supply 32 including one or more switching semiconductor devices and generating a wireless frequency, a power control circuit 33, and a voltage supply 31. For example, the one or more switching semiconductor devices include one or more switching transistors. The voltage supply 31 converts an alternating voltage input from the outside to a constant voltage and supplies the converted voltage to the AC switching power supply 32. The AC switching power supply 32 is operated according to the control of the power control circuit 33 and generates the wireless frequency.

The power control circuit 33 controls an operation of the AC switching power supply 32 to control the voltage and the current of the wireless frequency. The control of the control circuit 33 is performed based on an electrical or optical parameter value connected to at least one of the hybrid plasma source 20 and the hybrid plasma generated in the inside of the reactor body 11. To this end, the power control circuit 33 includes a measurement circuit for measuring the electrical or optical parameter value. For example, the measurement circuit for measuring the electrical and optical parameter of the plasma includes a current probe and an optical detector. The measurement circuit for measuring the electrical parameter of the hybrid plasma source 20 measures a driving current, a driving voltage, an average power, and a maximum power of the hybrid plasma source 20 and a voltage generated in the voltage supply 31.

The power control circuit 33 controls the AC switching power supply 32 while continuously monitoring the related electrical or optical parameter value through the measurement circuit and comparing the measured value and a reference value based on a normal operation, to control the voltage and the current of the wireless frequency. Although it is not specifically illustrated, the power supply 30 includes a protection circuit for preventing an electrical damage which may be generated due to an abnormal operation environment. The power supply 30 is connected to a system controller 60 for generally controlling the plasma processing system. The power supply 30 provides the system controller 60 with operation state information on the plasma reactor 10. The system controller 60 generates a control signal for generally controlling the operation of the plasma processing system and controls the operation of the plasma reactor 10 and the process chamber 40.

The plasma reactor 10 and the power supply 30 have a physically separated structure. That is, the plasma reactor 10 is electrically connected to the power supply 30 by a wireless frequency supply cable 35. The separation structure of the plasma reactor 10 and the power supply 30 secures easy repair and maintenance and easy installation. However, the plasma reactor 10 may be integrally formed with the power supply 30.

Figure 2A:
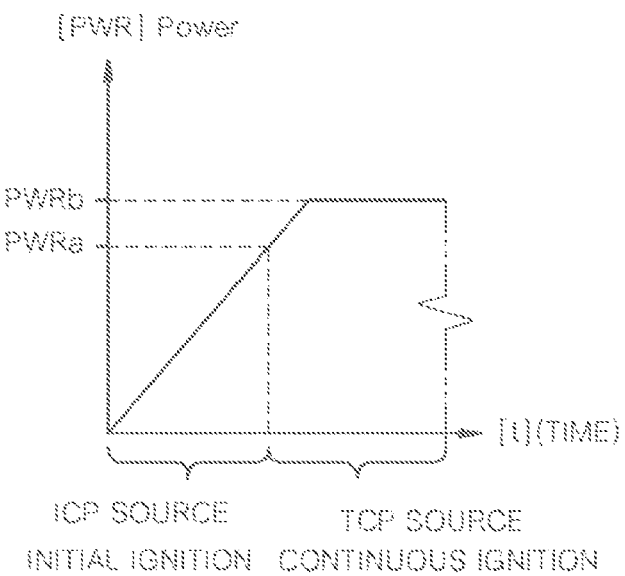
FIG. 2A is a graph illustrating an ignition process of a hybrid plasma reactor according to the present invention.
Figure 2B:
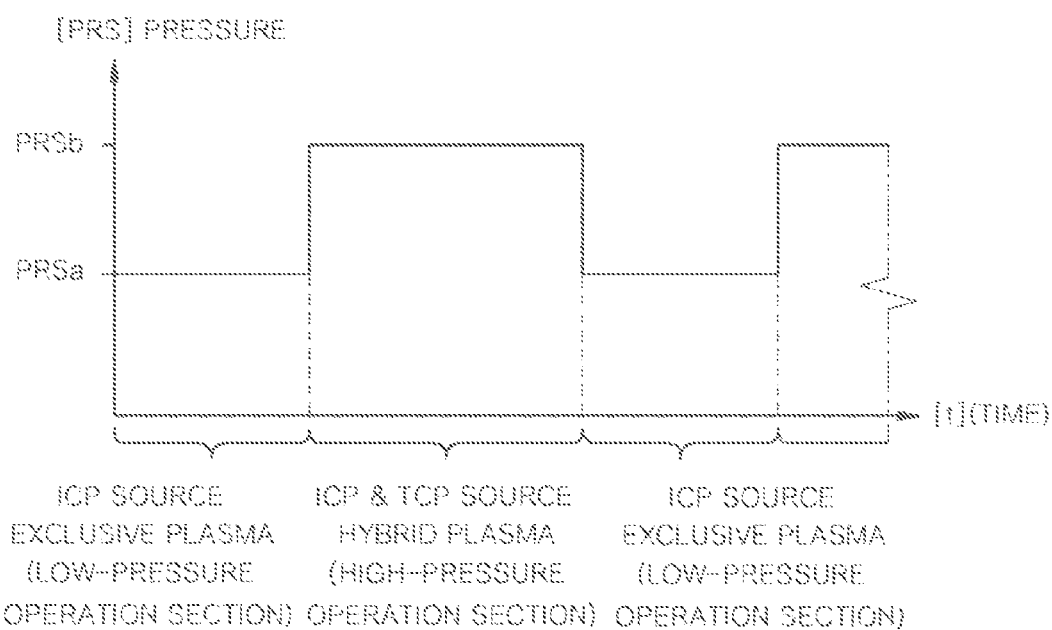
FIG. 2B is a graph illustrating an operation characteristic of a hybrid plasma reactor according to the present invention.

FIG. 2A is a graph illustrating an ignition process of the hybrid plasma reactor of the present invention and FIG. 2B is a graph illustrating an operation characteristic of the hybrid plasma reactor of the present invention.

Referring to FIG. 2A, the hybrid plasma reactor 10 of the present invention is characterized in that it is ignited by the inductively coupled plasma source 21 at an initial ignition and is continuously ignited by the transformer coupled plasma source 25 after the initial ignition. Accordingly, the hybrid plasma reactor 10 does not include a separate ignition circuit. Since the hybrid plasma reactor 10 does not include a separate ignition circuit, a circuit configuration becomes simple. Further, it is advantageously possible to reduce pollution generated in the ignition process when a conventional ignition circuit is included in an inside of the reactor body 11.

Referring to FIG. 2B, the hybrid plasma reactor 10 of the present invention may independently drive only the inductively coupled plasma source 21 in a low pressure condition of 1 torr or lower and maintain the ignition state of the plasma. The hybrid plasma reactor 10 of the present invention simultaneously drives the inductively coupled plasma source 21 and the transformer coupled plasma source 25 in a high pressure condition of 10 torr or higher and maintains the ignition of the plasma. While the conventional plasma reactor using only the transformed coupled plasma source is difficult to maintain the ignited plasma in a low pressure condition, the hybrid plasma reactor 10 of the present invention can maintain the ignition of the plasma both in a low pressure condition and a high pressure condition, so that it can be operated in a wide pressure condition.

Such an operational characteristic may be usefully used in relation to a process progressed in the process chamber 40. For example, the pressure condition of the plasma reactor 10 may be changed depending on various process characteristics, such as a substrate processing process and a cleaning process progressed by the process chamber 40. In this case, the plasma reactor 10 may appropriately respond to the process processed in the process chamber 40 regardless of the change of the pressure condition. For example, the pressure condition of the hybrid plasma reactor 10 may be changed depending on various process characteristics, such as a substrate processing process and a cleaning process progressed by the process chamber 40. In this case, through selectively operating one of the inductively coupled plasma source 21 and the transformer coupled plasma source 25 or operating both the inductively coupled plasma source 21 and the transformer coupled plasma source 25 according to the pressure condition, the hybrid plasma reactor 10 may appropriately respond to the process processed in the process chamber 40.

Figure 3:
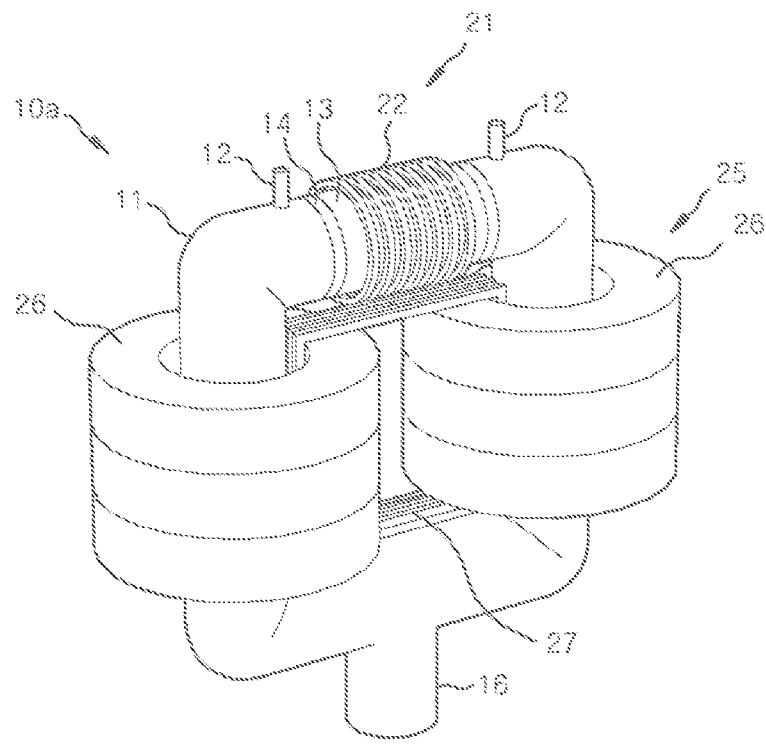
FIG. 3 is a perspective view illustrating a hybrid plasma reactor according to an embodiment of the present invention.
Figure 4:
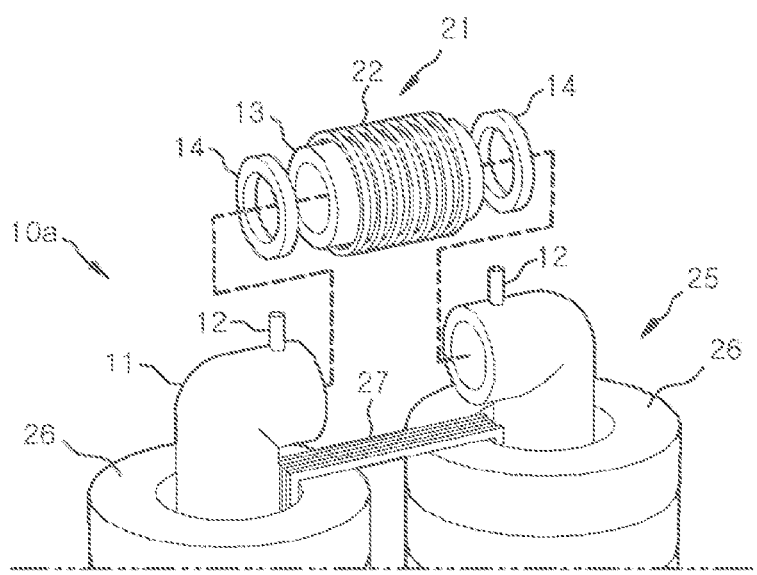
FIG. 4 is a perspective view illustrating an assembling of the inductively coupled plasma source of the hybrid plasma reactor of FIG. 3.
Figure 5:
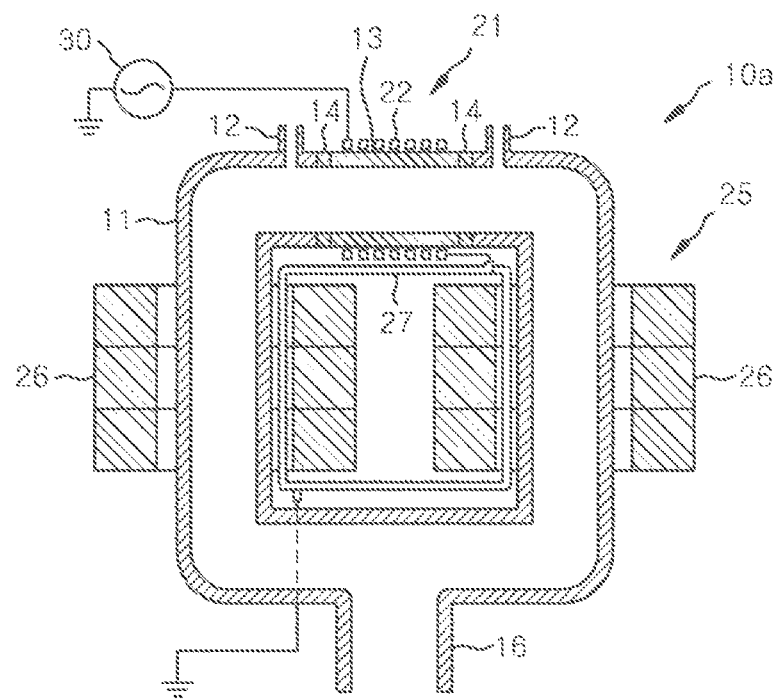
FIG. 5 is a sectional view illustrating the hybrid plasma reactor of FIG. 3.

FIG. 3 is a perspective view illustrating a hybrid plasma reactor according to an embodiment of the present invention, FIG. 4 is an exploded perspective view illustrating an assembling of the inductively coupled plasma source of the hybrid plasma reactor of FIG. 3, and FIG. 5 is a sectional view illustrating the hybrid plasma reactor of FIG. 3.

Referring to FIGS. 3 to 5, a hybrid plasma reactor 10a according to the embodiment of the present invention has a single continued ring-shaped structure in which a dielectric window 13 having a hollow tube structure and the reactor body 11. An inductive antenna 22 configuring the inductively coupled plasma source 21 is wound around an outer peripheral area of the dielectric window 13. Although it is not illustrated in the drawing, the hybrid plasma reactor 10a includes a hollow protection tube entirely surrounding the dielectric window 13 and the inductive antenna 22. At least one magnetic core 26 having a primary winding coil 27 configuring the transformer coupled plasma source 25 is mounted to the reactor body 11. As illustrated in the drawings, the magnetic core 26 has a ring-shaped structure and may be separately mounted to two areas of the reactor body 11. The primary winding coil 27 is commonly wound in the magnetic cores 26 mounted to the two divided areas of the reactor body 11. The reactor body 11 and the dielectric window 13 are interconnected while vacuum insulation rings 14 are interposed therebetween.

The reactor body 11 may be made of a conductive material, e.g. aluminum. Otherwise, the reactor body 11 may be made of an insulator material. When the reactor body 11 is made of a conductive material, it is preferable to use an anodized conductive material. When the reactor body 11 is made of a conductive material, it may be very usefully to use a complex material, e.g. a complex material including aluminum covalently bond to carbon nanotube. The complex material has a characteristic in that strength of the complex material is approximately three times than that of aluminum and a weight is light compared to the strength of the complex material. Although it is not specifically illustrated, the reactor body 11 includes a cooling channel for preventing overheating in an inside thereof. Otherwise, a cooling cover for covering the reactor body may be separately included. Further, a cooling means may be separately included in order to prevent overheating of the electrical components, such as the magnetic core 26, the primary winding coil 27, and the inductive antenna.

The gas inlets 12 are formed in an upper part of the reactor body 11 and the gas outlet 16 is formed in the lower part of the reactor body 11. In the embodiment, the two gas inlets 12 are formed adjacently to both ends of the dielectric window 13. The gas outlet 16 is connected to the process chamber 40 through the adapter 48. The gas introduced through the two gas inlets 12 flows along a ring-shaped path formed by the reactor body 11 and the dielectric window 13 and exhausted through the gas outlet 16 in a lower end of the reactor body 11.

The inductive antenna 22 and the primary winding coil 27 are series connected to the power supply 30. When a wireless frequency is supplied from the power supply to the inductive antenna 22 and the primary winding coil 27, an induced electromotive force is transferred to the gas flowing through the ring-shaped path, so that the plasma discharge is started. At this time, the initial ignition is generated by the electromotive force induced to the inside of the dielectric window 13 by the inductive antenna 22. After the initial ignition, the plasma discharge is spread along the ring-shaped path by the electromotive force induced to the inside of the reactor body 11 by the primary winding coil 27 wound in the magnetic core 26.

In the hybrid plasma reactor 10a of the present invention, the initial ignition is generated by the inductive antenna 22 configuring the inductively coupled plasma source 21, so that it is not necessary to separately include an ignition electrode in the inside of the reactor body 11. Further, the initial ignition is generated by the inductive antenna 22, so that it is very easy to initially ignite the plasma and maintain the ignition of the plasma in a low pressure condition. Further, the plasma discharge is continued by the transformer coupled plasma source 25 in a high pressure condition, so that a large volume of plasma is very easily generated.

Figure 6:
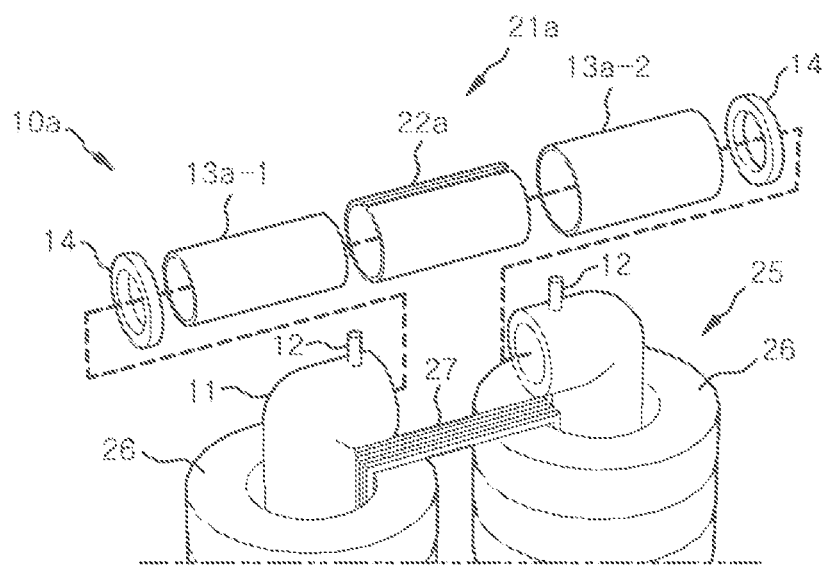
FIG. 6 is an exploded perspective view illustrating an assembling of a part of a hybrid plasma reactor employing a plate-type inductive antenna.
Figure 7:
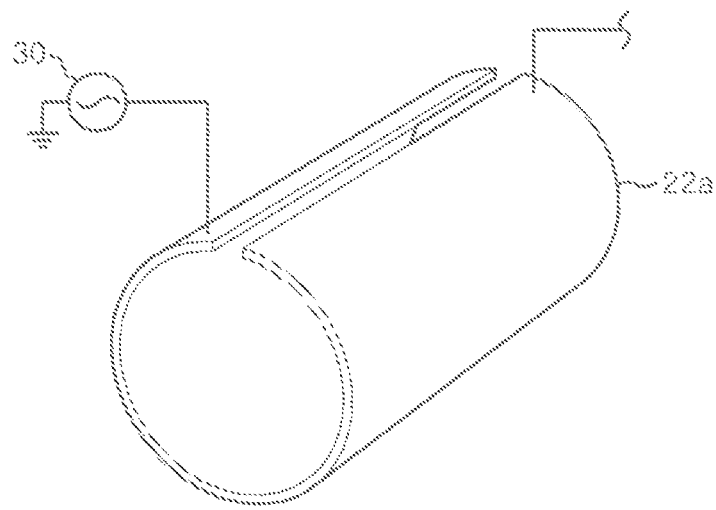
FIG. 7 is a perspective view illustrating a plate-type inductive antenna for describing an electrical connection structure of the plate-type inductive antenna of FIG. 6.
Figure 8:
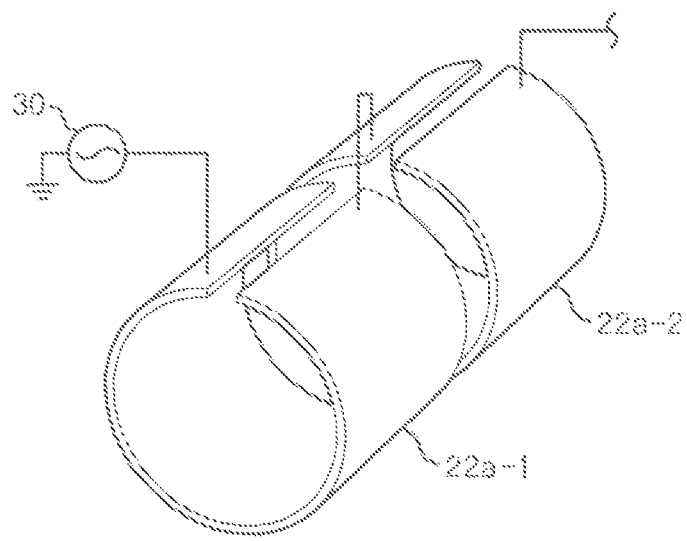
FIGS. 8 and 9 are views illustrating variously modified structures of the plate-type inductive antenna of FIG. 6.
Figure 9:
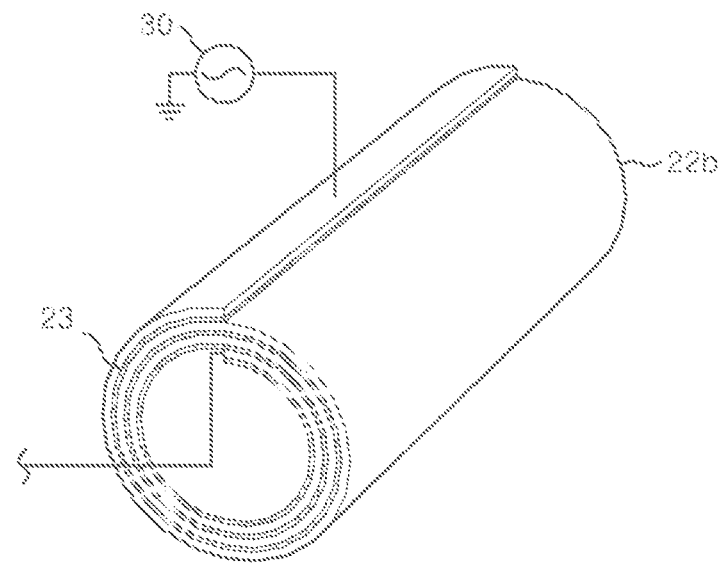

FIG. 6 is an exploded perspective view illustrating an assembling of a part of the hybrid plasma reactor employing a plate-type inductive antenna, FIG. 7 is a perspective view illustrating the plate-type inductive antenna for describing an electrical connection structure of the plate-type inductive antenna of FIG. 6, and FIGS. 8 and 9 are views illustrating variously modified structures of the plate-type inductive antenna of FIG. 6.

Referring to FIG. 6, an inductively coupled plasma source 21a included in the plasma reactor 10a may be formed of the plate-type inductive antenna 22a having a cylindrical structure. Cylindrical dielectric windows 13a-1 and 13a-2 are installed in an inside and an outside of the plate-type inductive antenna. The plate-type inductive antenna 22a has a discontinued cylindrical structure, and as illustrated in FIG. 7, one end of the plate-type inductive antenna 22 is connected to the power supply 30 and an opposite end of the plate-type inductive antenna 22 is electrically connected to the primary winding coil 27 to serve as an one-turn antenna. Otherwise, as illustrated in FIG. 9, the plate-type inductive antenna 22b is wound together with an insulation member 23 several times, to serve as a multi-turn antenna. As described above, the inductive antennas 22, 22a, and 22b configuring the inductively coupled plasma source 21 may be variously modified based on the present invention.

FIGS. 10 to 14 are views illustrating various embodiments of an electrical connection structure of the inductively coupled plasma source and the transformer coupled plasma source of the hybrid plasma reactor of FIG. 3.

Figure 10:
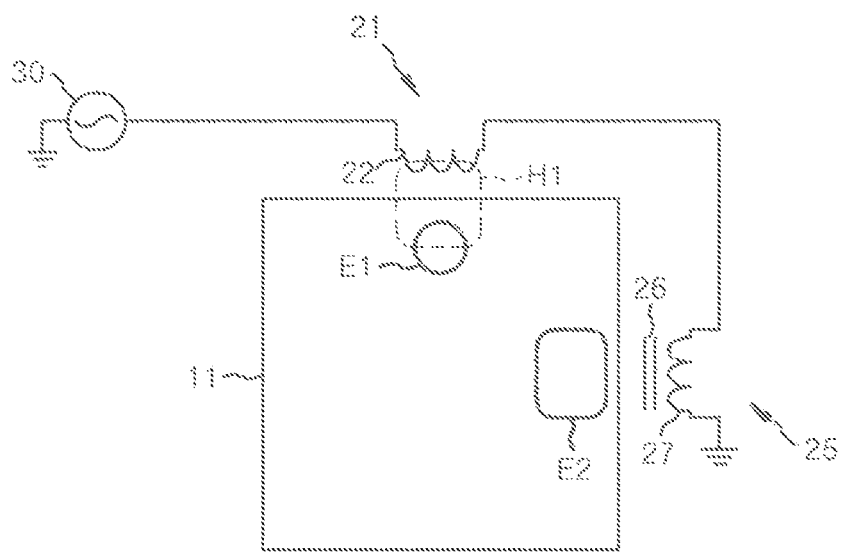
FIGS. 10 to 14 are views illustrating various embodiments of an electrical connection structure of an inductively coupled plasma source and a transformer coupled plasma source of the hybrid plasma reactor of FIG. 3.

Referring to FIG. 10, the inductively coupled plasma source 21 and the transformer coupled plasma source 25 included in the hybrid plasma reactor 10 of the present invention receive a wireless frequency from the power supply to be operated. The inductive antenna 22 of the inductively coupled plasma source 21 and the primary winding coil 27 of the transformer coupled plasma source 25 may have a structure series connected to the power supply 30. When the wireless frequency is supplied from the power supply 30, an induced electric field E1 is generated in the inside of the reactor body 11 from a magnetic field H1 generated by the inductive antenna 22 and another inductive electric field E2 is generated in the inside of the reactor body 11 from a magnetic filed (not separately indicated) generated in the primary winding coil 27 wound in the magnetic core 26. As such, the plasma discharge is generated in the inside of the reactor body 11 by the electric fields E1 and E2 induced by the inductive antenna 22 and the primary winding coil 27, respectively.

Figure 11:
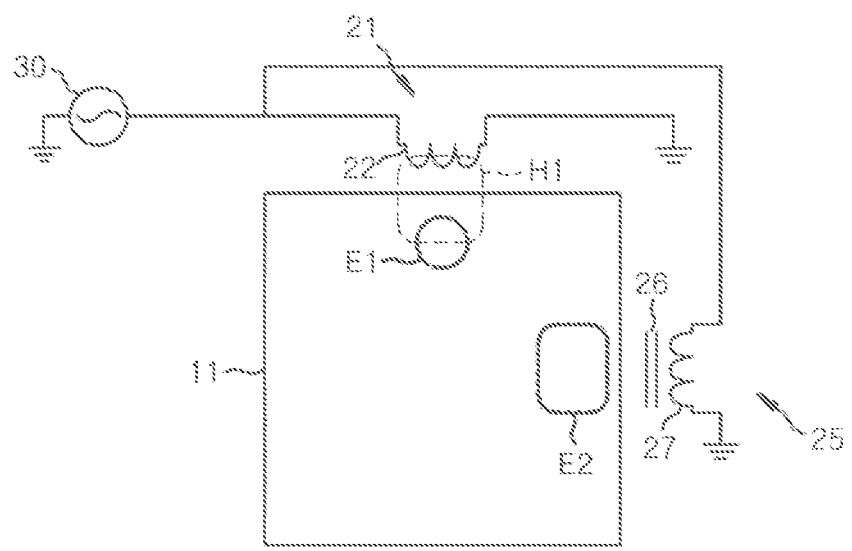
Figure 12:
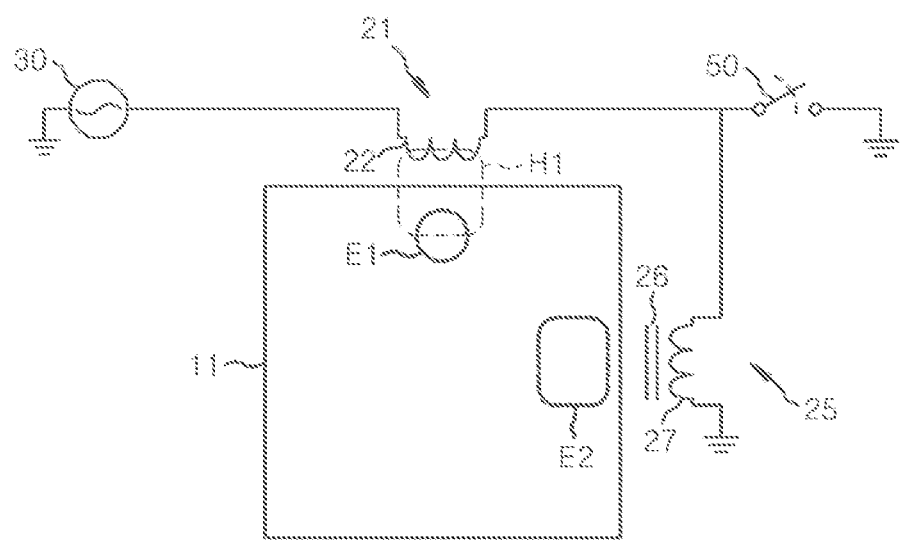
Figure 13:
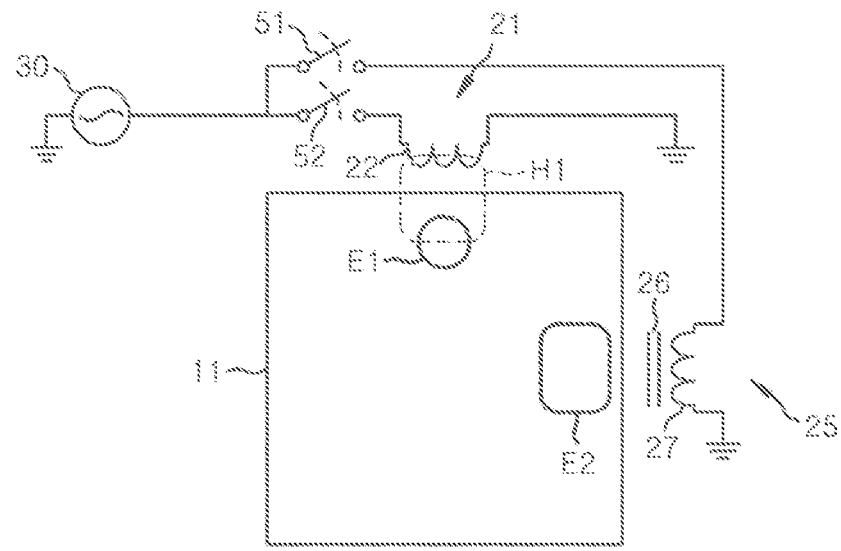
Figure 14:
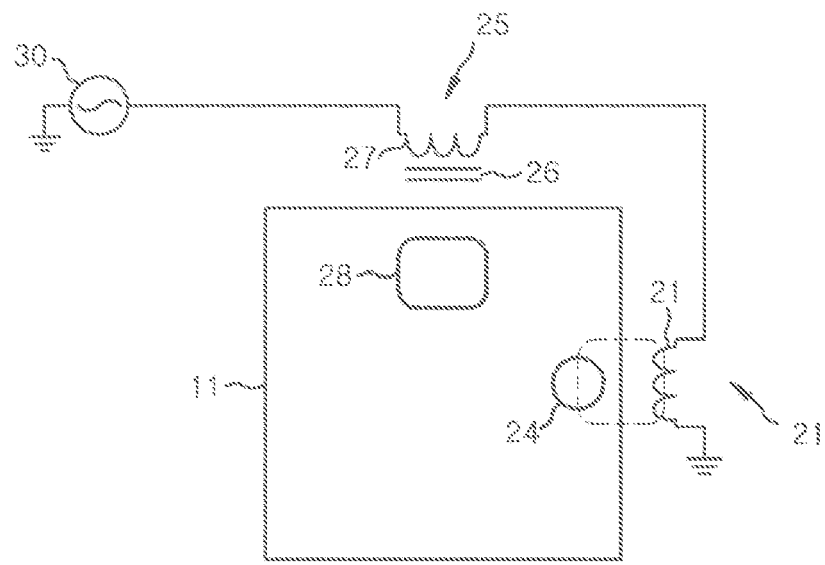

An electric scheme by which the inductive antenna 22 and the primary winding coil 27 are connected to the power supply 30 is variously changed and performed as described below. For example, as illustrated in FIG. 11, in a modified electrical connection structure, the primary winding coil 27 is first connected to the power supply 30 and then the inductive antenna 21 is connected to the power supply 30. As illustrated in FIG. 12, the inductive antenna 22 and the primary winding coil 27 may be parallel connected to the power supply 30. As illustrated in FIG. 13, a switching circuit 50 ground connected to connection nodes of the inductive antenna 22 and the primary winding coil 27 may be connected to the power supply 30. In this case, the switching circuit 50 makes the connection nodes be selectively ground connected. Accordingly, when the switching circuit 50 is on and the connection node is ground connected, the inductively coupled plasma source 21 is only driven, and when the switching circuit 50 is off, the inductively coupled plasma source 21 and the transformer coupled plasma source 25 are simultaneously driven. Otherwise, as illustrated in FIG. 14, the inductive antenna 22 and the primary winding coil 27 may be parallel connected to the power supply 30 through a first switching circuit 51 and a second switching circuit 52 connected to the power supply 30. In this case, the inductively coupled plasma source 21 and the transformer coupled plasma source 25 may be simultaneously driven or one of the inductively coupled plasma source 21 and the transformer coupled plasma source 25 may be selectively driven, or the driving of both the inductively coupled plasma source 21 and the transformer coupled plasma source 25 may be stopped depending on a switching operation of the first switching circuit 51 and the second switching circuit 52.

Figure 15:
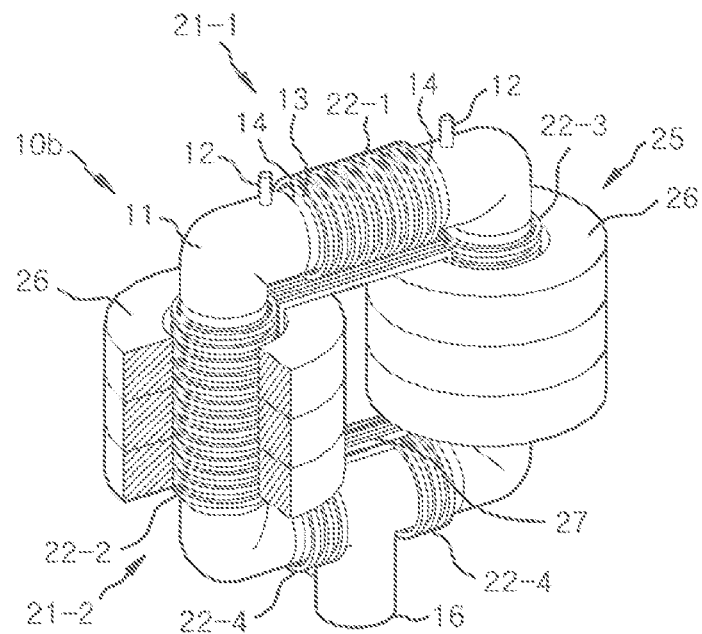
FIG. 15 is a perspective view illustrating a modified example of a hybrid plasma reactor including multiple inductively coupled plasma sources.
Figure 16:
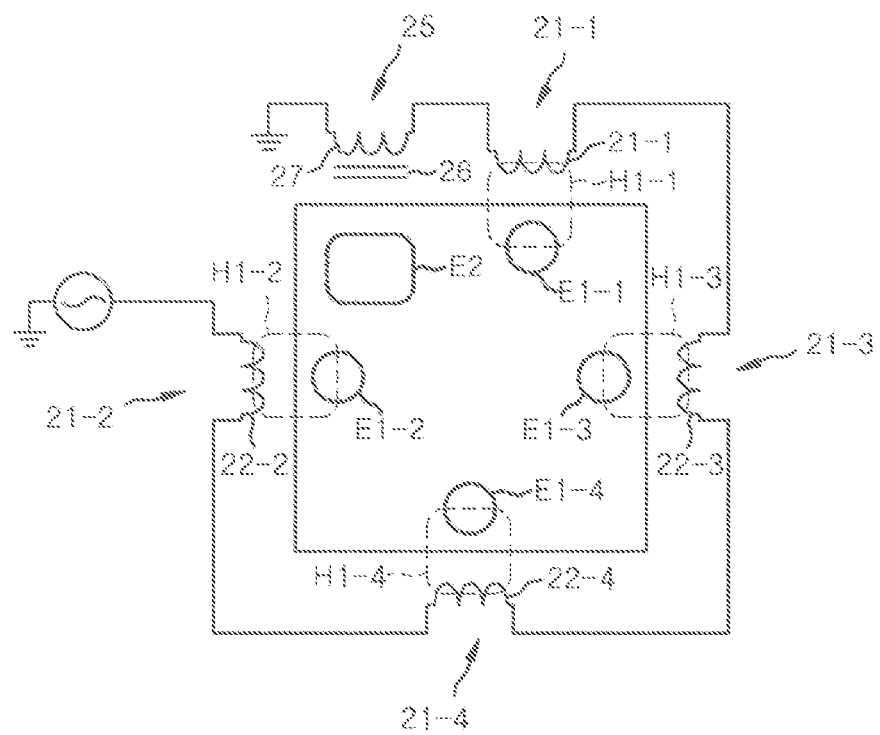
FIG. 16 is a view illustrating an electrical connection structure of multiple inductively coupled plasma sources and a transformer coupled plasma source of the hybrid plasma reactor of FIG. 15.

FIG. 15 is a perspective view illustrating a modified example of a hybrid plasma reactor including multiple inductively coupled plasma sources and FIG. 16 is a view illustrating an electrical connection structure of multiple inductively coupled plasma sources and the transformer coupled plasma source of the hybrid plasma reactor of FIG. 15.

Referring to FIGS. 15 and 16, a hybrid plasma reactor 10b according to the modified example includes multiple inductively coupled plasma sources 21-1 to 21-4 and the single transformer coupled plasma source 25. The multiple inductively coupled plasma sources 21-1 to 21-4 is formed by winding the inductive antennas 22-1 to 22-4 to the dielectric windows installed in each of the divided parts of the reactor body 11. As illustrated in FIG. 16, the multiple inductive antennas 22-1 to 22-4 induce multiple electric fields E1-1 to E1-4 in the inside of the reactor body 11, respectively, to generate the plasma discharge. The basic structure of the series connection between the multiple inductive antennas 22-1 to 22-4 and the single primary winding coil 27 is exemplified, but those skilled in the art may variously modify and implement the connection structure based on the present invention. Otherwise, the switching circuit for selectively operating any one the multiple inductive antennas may be included.

Figure 17:
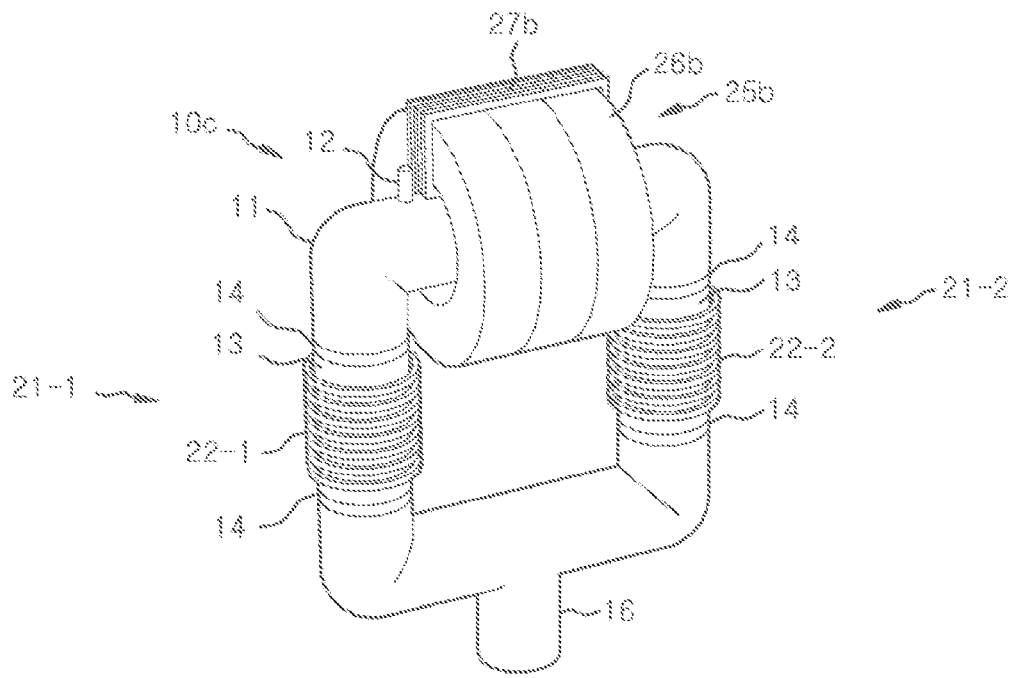
FIG. 17 is a perspective view illustrating another modified example of a hybrid plasma reactor including two inductively coupled plasma sources and a single transformer coupled plasma source.
Figure 18:
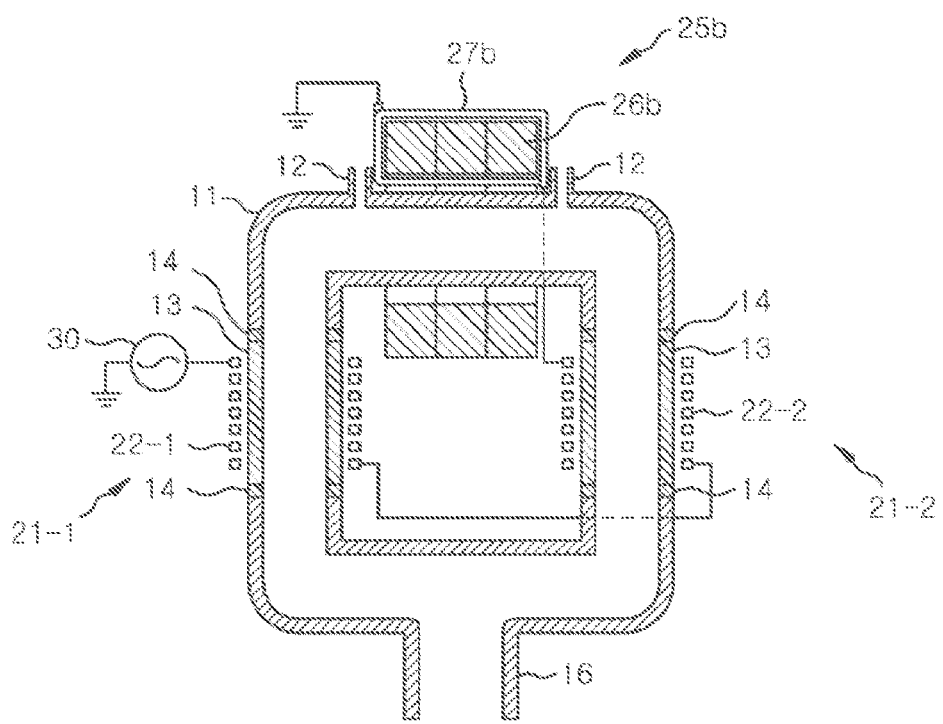
FIG. 18 is a sectional view illustrating the hybrid plasma reactor of FIG. 17.
Figure 19:
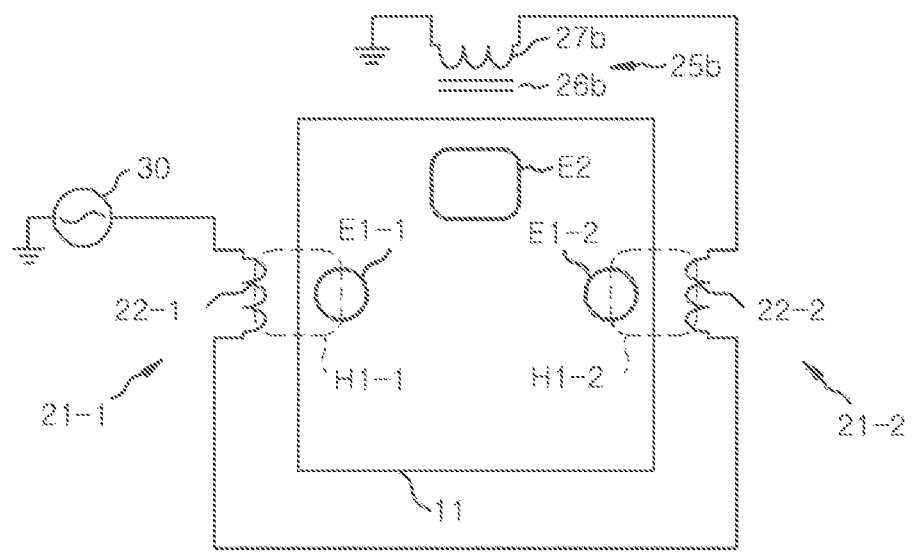
FIGS. 19 to 22 are views illustrating various embodiments of an electrical connection structure of the two inductively coupled plasma sources and the single transformer coupled plasma source of the hybrid plasma reactor of FIG. 17.
Figure 20:
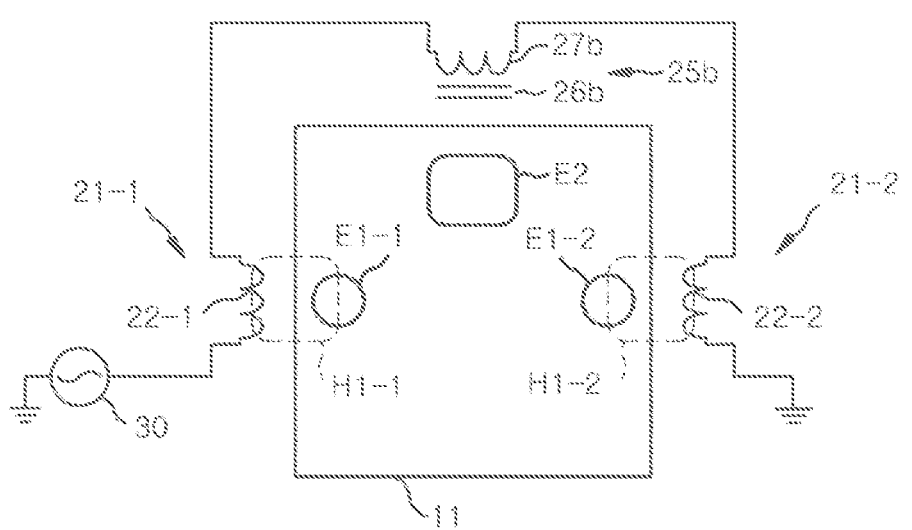
Figure 21:
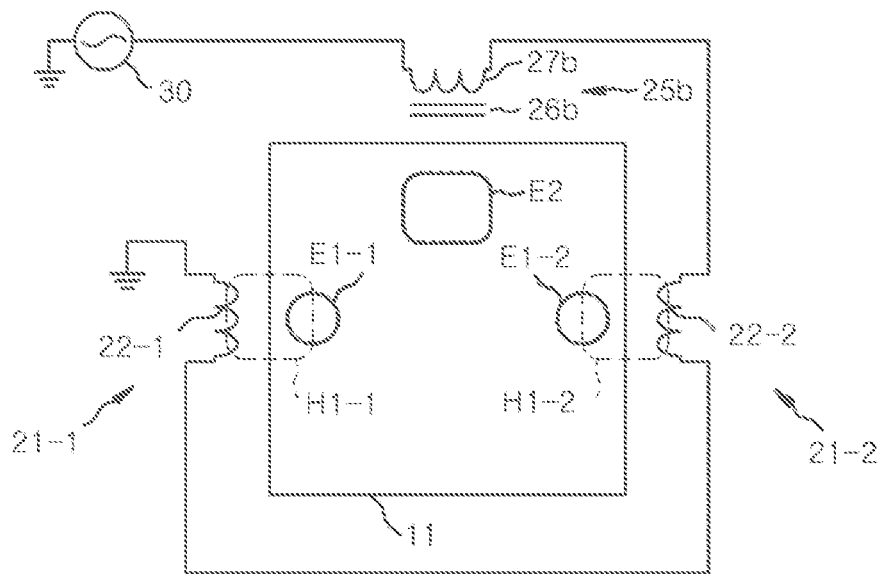
Figure 22:
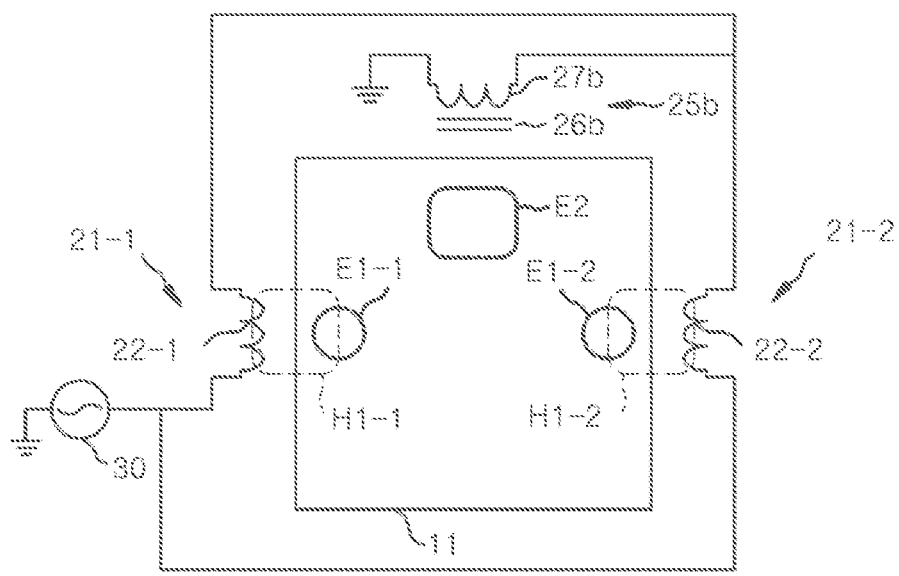

FIG. 17 is a perspective view illustrating another modified example of a hybrid plasma reactor including two inductively coupled plasma sources and a single transformer coupled plasma source, FIG. 18 is a sectional view illustrating the hybrid plasma reactor of FIG. 17, and FIGS. 19 to 22 are views illustrating various embodiments of an electrical connection structure of the two inductively coupled plasma sources and the single transformer coupled plasma source of the hybrid plasma reactor of FIG. 17.

Referring to FIGS. 17 and 18, a hybrid plasma reactor 10c according to another modified example of the present invention includes a single transformer coupled plasma source 25b and two inductively coupled plasma sources 21-1 and 21-2. The two inductively coupled plasma sources 21-1 and 21-2 are symmetrically installed in the ring-shaped reactor body 11 and the transformer coupled plasma source 25b is installed between the two inductively coupled plasma sources 21-1 and 21-2. The structure of the electrical connection between a single primary winding coil 27b and two inductive antennas 22-1 and 22-2 may be a series or parallel electric connection structure as illustrated in FIGS. 19 to 22. Although it is not illustrated in the drawings, the switching circuit for selectively operating any one of the inductive antennas may be included.

Figure 23:
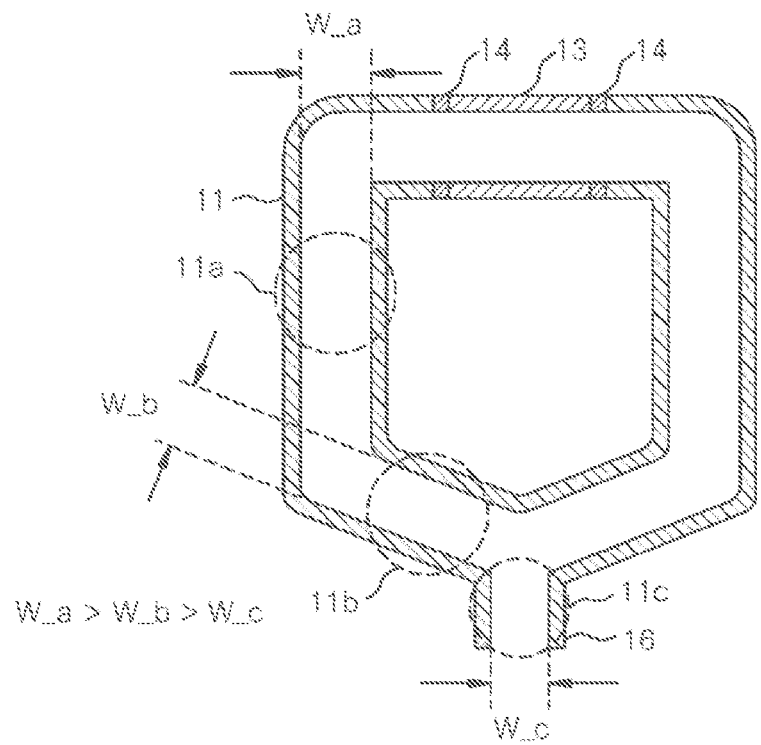
FIG. 23 is a sectional view schematically illustrating a reactor body for describing a relation structure of an inner diameter depending on a position of the reactor body in a hybrid plasma reactor according to the present invention.

FIG. 23 is a sectional view schematically illustrating the reactor body for describing a relation structure of an inner diameter depending on a position of the reactor body in the hybrid plasma reactor according to the present invention.

Referring to FIG. 23, the reactor body 11 is connected to the dielectric window 13 to provide a hollow ring-shaped path. The gas introduced from the upper part of the reactor body 11 flows through a branched upper path 11a and collected in an exhausting path 11c via a low path 11b, to be finally exhausted through the gas outlet 16. In this case, it is preferable that an inner diameter W_a of the upper path 11a, an inner diameter W_b of the lower path 11b, and an inner diameter W_c of the exhausting path 11c become gradually narrower. A change of a ratio of the inner diameter may be set considering a flow rate of gas inside the reactor body 11 and a gas resolution ratio.

Figure 24:
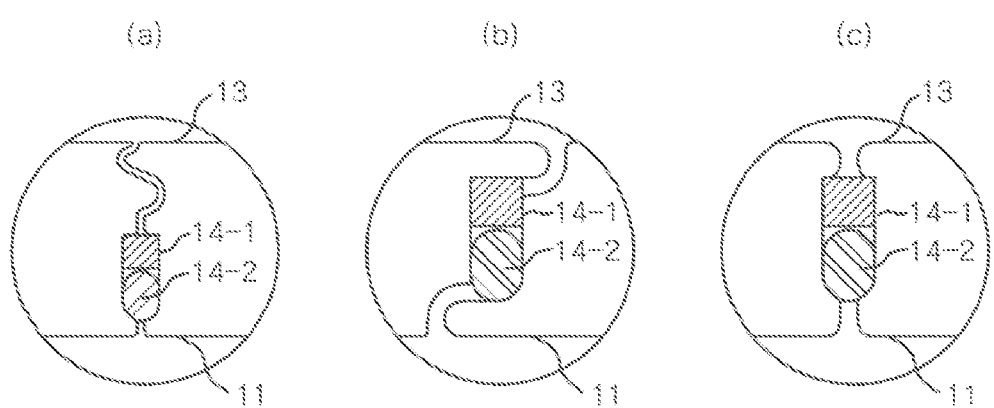
FIGS. 24A to 24C are views illustrating an interconnection structure for vacuum insulation of a dielectric window of a reactor body in a hybrid plasma reactor according to the present invention.

FIGS. 24A to 24C are views illustrating an interconnection structure for vacuum insulation of the dielectric window of the reactor body in the hybrid plasma reactor according to the present invention.

Referring to FIGS. 24A to 24C, a vacuum insulation ring 14 for appropriate vacuum insulation is formed between the reactor body 11 and the dielectric window 13. In this case, the vacuum ring 14 may include two members 14-1 and 14-2. One is an elastic member 14-1 and the other is a non-elastic member 14-2. The elastic member 14-1 is used for the actual vacuum insulation and installed close to an external region of the reactor body 11, and the non-elastic member 14-2 is installed close to a plasma discharge region within the reactor body 11. Accordingly, it is possible to prevent the elastic member 14 from being degraded by high-temperature plasma gas.

Figure 25:
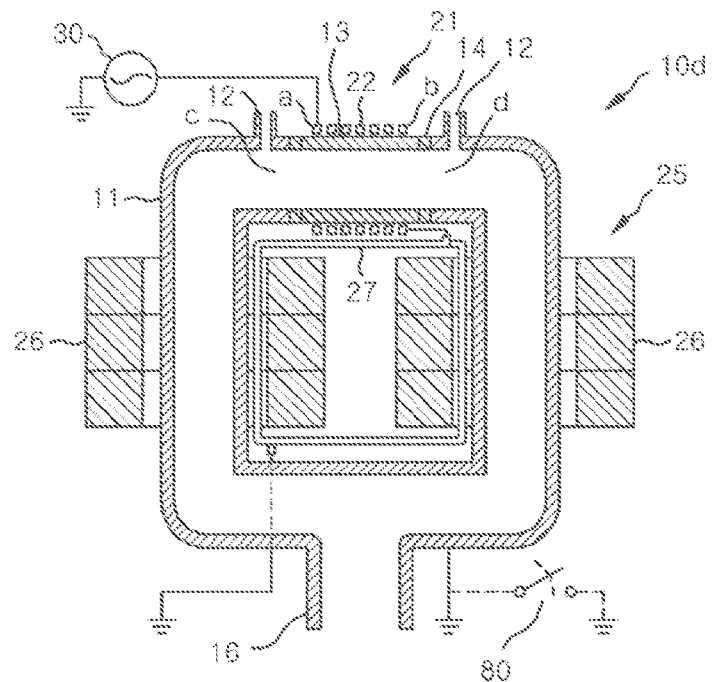
FIG. 25 is a sectional view illustrating another modified example of a hybrid plasma reactor according to the present invention.
Figure 26:
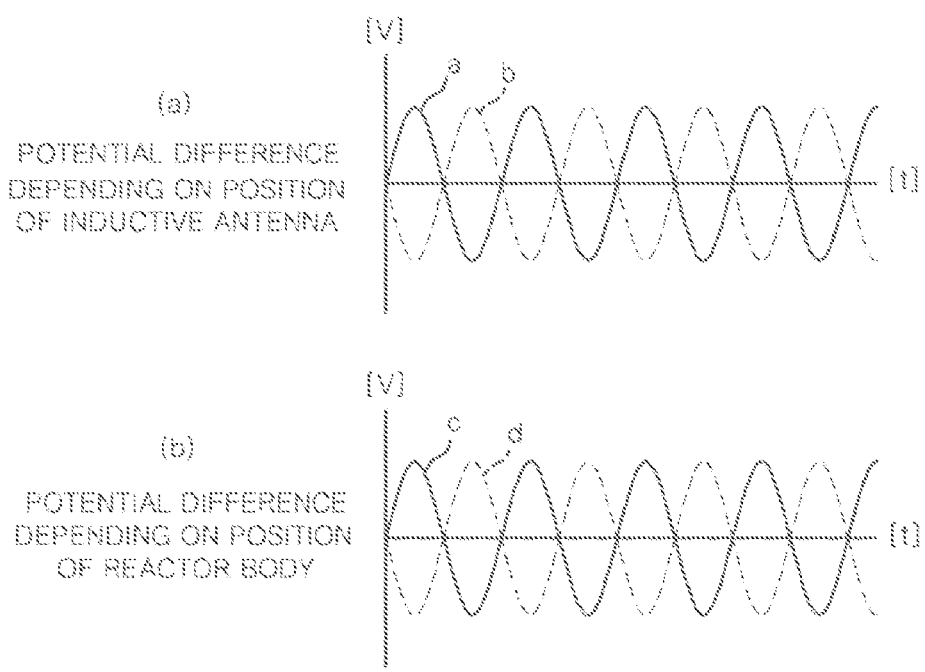
FIGS. 26A and 26B are graphs illustrating a waveform for describing a potential difference depending on a position of the hybrid plasma reactor of FIG. 25.
Figure 27:
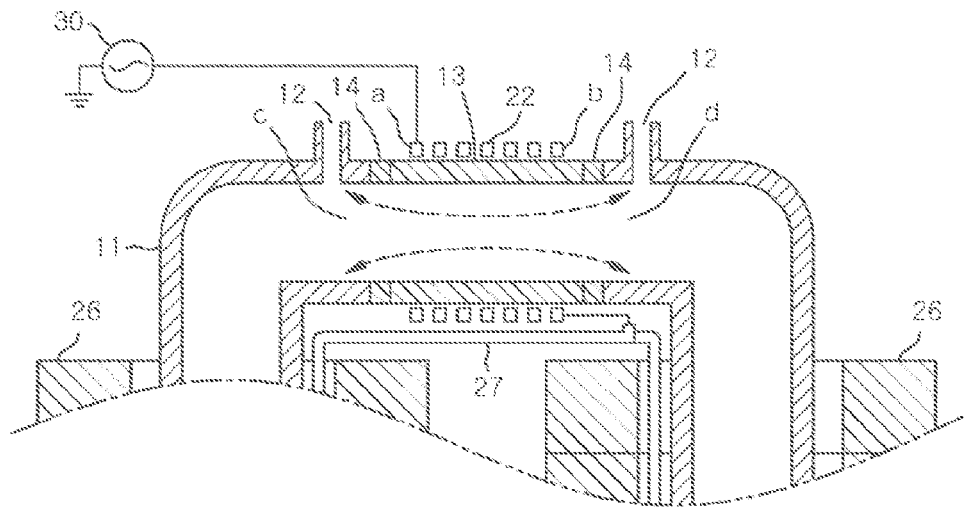
FIG. 27 is a partial sectional view illustrating a plasma reactor for describing a plasma discharge generated according to a potential difference generated within the plasma reactor.

FIG. 25 is a sectional view illustrating another modified example of a hybrid plasma reactor according to the present invention, FIGS. 26A and 26B are graphs illustrating a waveform for describing a potential difference depending on a position of the hybrid plasma reactor of FIG. 25, and FIG. 27 is a partial sectional view illustrating a plasma reactor for describing a plasma discharge generated according to a potential difference generated within the plasma reactor.

Referring to FIG. 25, a hybrid plasma reactor 10d according to a modified example of the present invention is ground connected to the reactor body 11. When the reactor body 11 is ground connected, a potential different is generated in a position of the inductive antenna 22. The potential different is generated at both ends a and b of the inductive antenna 22 to which the wireless frequency is supplied as illustrated in FIG. 26A. Further, as illustrated in FIG. 26b, the potential difference is similarly generated at upper ends c and d of the reactor body 11 proximate to the inductive antenna 22. The potential difference is repetitively generated depending on the wireless frequency. Accordingly, the plasma discharge is generated by the potential difference (as illustrated with an arrow) generated between both ends in the inside of the reactor body 11.

The plasma discharge is basically performed together with the discharge by the inductively coupled plasma source 21, thereby achieving the effect of increasing the plasma ignition efficiency and the plasma discharge maintenance efficiency of the hybrid plasma reactor 10d of the present invention. As illustrated in FIG. 25, a separate switching circuit is formed between the ground and the reactor body 11 such that the reactor body 11 may be selectively ground connected.

Figure 28:
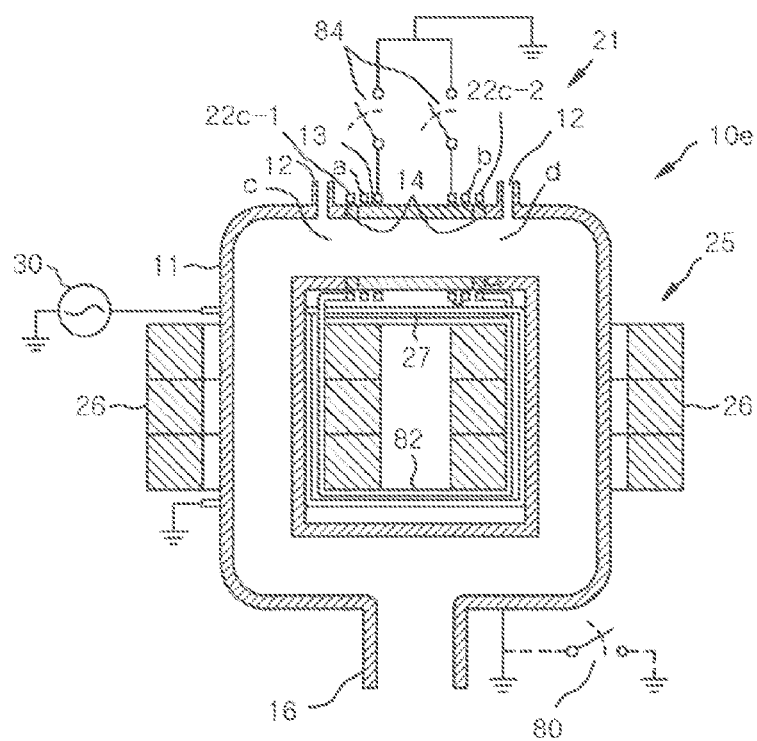
FIG. 28 is a sectional view illustrating another modified example of a hybrid plasma reactor according to the present invention.
Figure 29:
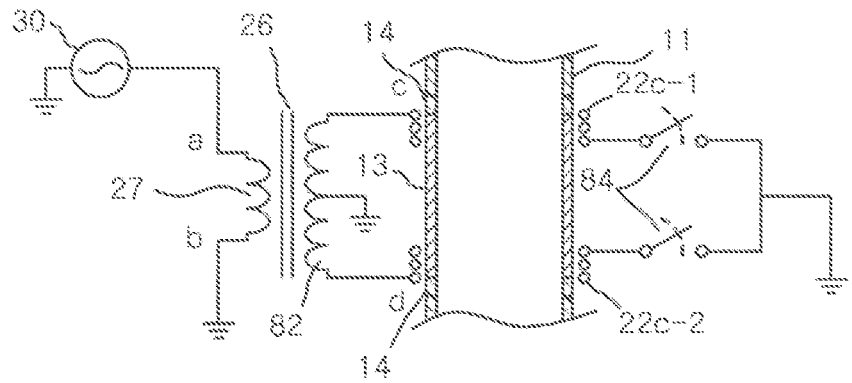
FIG. 29 is a diagram of a circuit of the plasma reactor of FIG. 28.
Figure 30:
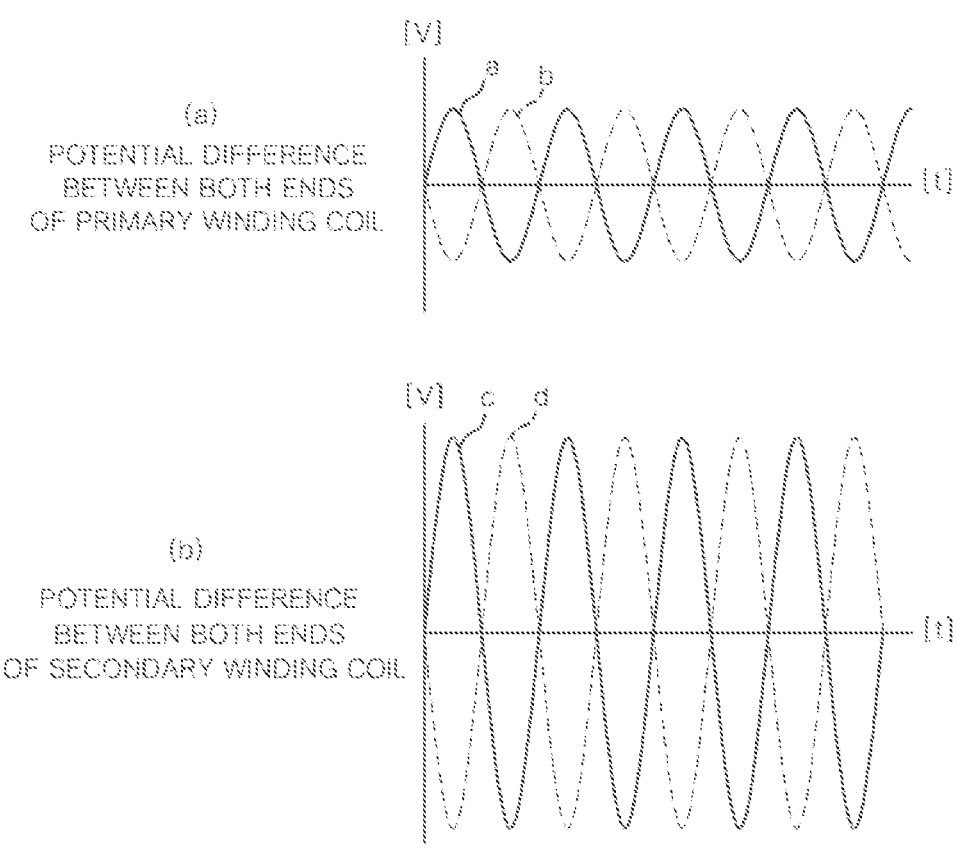
FIGS. 30A and 30B are graphs illustrating a waveform for describing a potential difference depending on a position of the plasma reactor of FIG. 28.
Figure 31:
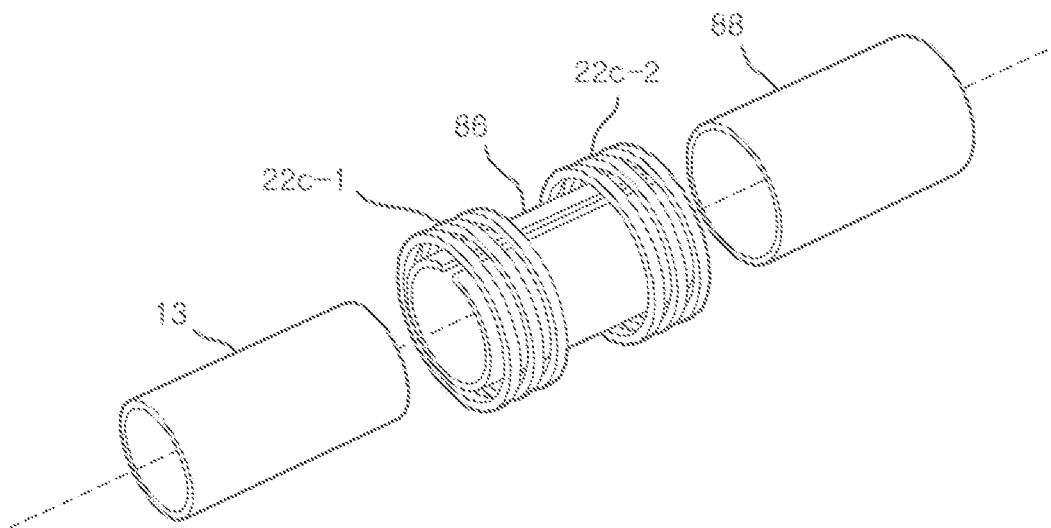
FIG. 31 is a partial perspective view illustrating a discontinuous conductive tube installed in an internal side of an area wound with a conductive antenna.

FIG. 28 is a sectional view illustrating another modified example of a hybrid plasma reactor according to the present invention, FIG. 29 is a diagram of a circuit of the plasma reactor of FIG. 28, FIGS. 30A and 30B are graphs illustrating a waveform for describing a potential difference depending on a position of the plasma reactor of FIG. 28, and FIG. 31 is a partial perspective view illustrating a discontinuous conductive tube installed in an internal side of an area wound with a conductive antenna.

Referring to FIGS. 28 and 29, in a hybrid plasma reactor 10e of another modified example, a primary winding coil is connected to the power supply 30 and the magnetic core 26 includes a secondary winding coil 82. Both ends of the secondary winding coil 82 are connected to inductive antennas 22c-1 and 22c-2 of the inductively coupled plasma source 21. The inductive antennas 22c-1 and 22c-2 are formed in separated two areas, and one inductive antenna is adjacently positioned to an upper end c of the reactor body 11 and the other inductive antenna is adjacently positioned to another upper end d of the reactor body 11. The reactor body 11 is ground connected.

Through the aforementioned construction, as illustrated in FIG. 30, when a wireless frequency is supplied from the power supply 30 to the primary winding coil 27, the voltage induced to the secondary winding coil 82 is applied to the inductive antennas 22c-1 and 22c-2 according to a winding ratio. Accordingly, a similar potential difference is generated in the upper ends c and d of the reactor body 11 to which the inductive antenna 22 is adjacent. Such a potential difference is repetitively created according to the wireless frequency. Accordingly, the plasma discharge is generated by the potential difference generated between the both ends of the upper inside of the reactor body. Through adjusting the winding ratio of the secondary winding coil 82, it is possible to make the voltage applied to the inductive antennas 22c-1 and 22c-2 be higher than the wireless frequency and thus it is possible to easily ignite the plasma in the initial plasma ignition.

One end of each of the two divided inductive antennas 22c-1 and 22c-2 is connected to both ends of the secondary winding coil 82 and the other end thereof is in a floating state. Otherwise, a separate switching circuit 84 is included such that the inductive antennas 22c-1 and 22c-2 are selectively ground connected. In order to further improve the efficiency, as illustrated in FIG. 31, a discontinuous conductive tube 86 may be included in an internal side of an area around which the inductive antennas 22c-1 and 22c-2 are wound. That is, the discontinuous conductive tube 86 is positioned between the dielectric window 13 and the inductive antennas 22c-1 and 22c-2. An insulation cover 88 is formed between the discontinuous conductive tube 86 and the inductive antennas 22c-1 and 22c-2. The meaning of discontinuity in the discontinuous conductive tube 86 is to have a discontinuous gap 87 disconnected such that vortex is not generated within the discontinuous conductive tube 85 by electromotive force inducted by the inductive antennas 22c-1 and 22c-2. The discontinuous gap 87 includes a gap insulation member 89.

As described above, when the present invention includes the discontinuous conductive tube 86, the potential difference between the both ends is obviously generated, so that it is possible to improve the plasma discharge efficiency. As illustrated in FIG. 28, the separate switching circuit 80 is formed between the ground and the reactor body 11 such that the reactor body 11 is selectively ground connected.

Figure 32:
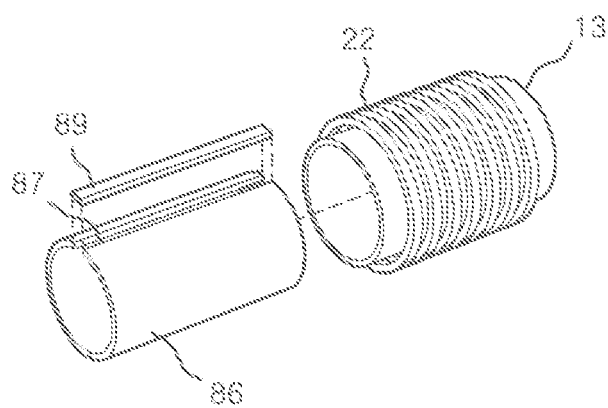
FIG. 32 is a partial perspective view illustrating an example of a discontinuous conductive tube installed in a dielectric window.

The discontinuous conductive tube 86 may be included within the dielectric window 13 as illustrated in FIG. 32. The discontinuous gap 87 included in the discontinuous conductive tube 86 includes the gap insulation member 89. The inductive antenna 22 formed in the outside of the dielectric window 13 may have one continuous antenna structure or a separated antenna structure as described above. The discontinuous conductive tube 89 may have an electrically floated structure or the ground connected structure, and the separate switching circuit may be included for the selective ground connection.

Figure 33:
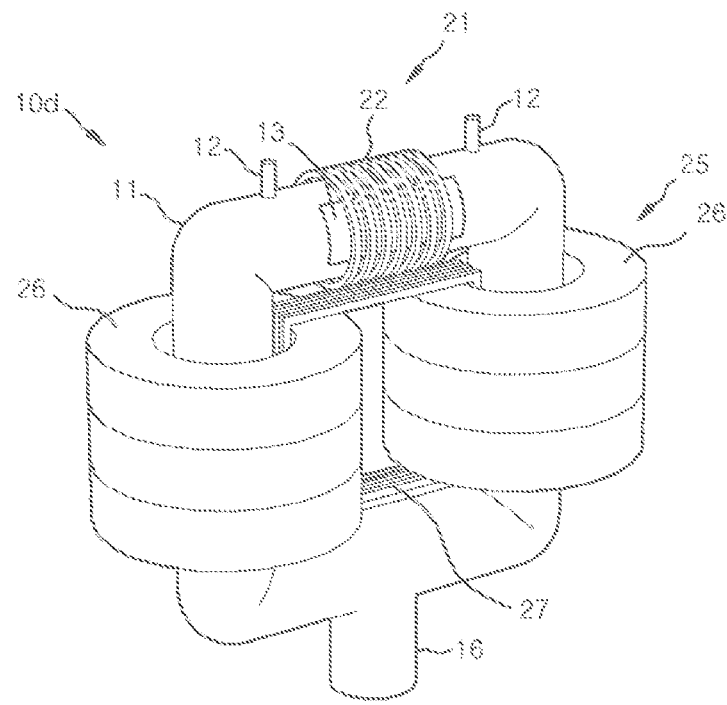
FIG. 33 is a perspective view illustrating another modified example of a hybrid plasma reactor according to the present invention.

FIG. 33 is a perspective view illustrating another modified example of a hybrid plasma reactor according to the present invention.

Referring to FIG. 33, in a hybrid plasma reactor 10e according to a modified example of the present invention, a dielectric window 13 does not have a cylindrical structure but a window structure in which a part of an upper area of a reactor is opened and covered as illustrated in the drawing. Although not illustrated in detail in the drawing, an insulation member is included between the dielectric window 13 and the reactor body 11, the insulation member being used to make a vacuum insulation. In case of constructing the reactor body 11 with a conductive member, one or more electrical insulation intervals (not shown) are included in order to prevent an eddy being formed in the reactor body 11. Since other constructions are the same as the constructions of embodiments described above, the repeated description will be omitted.

Figure 34:
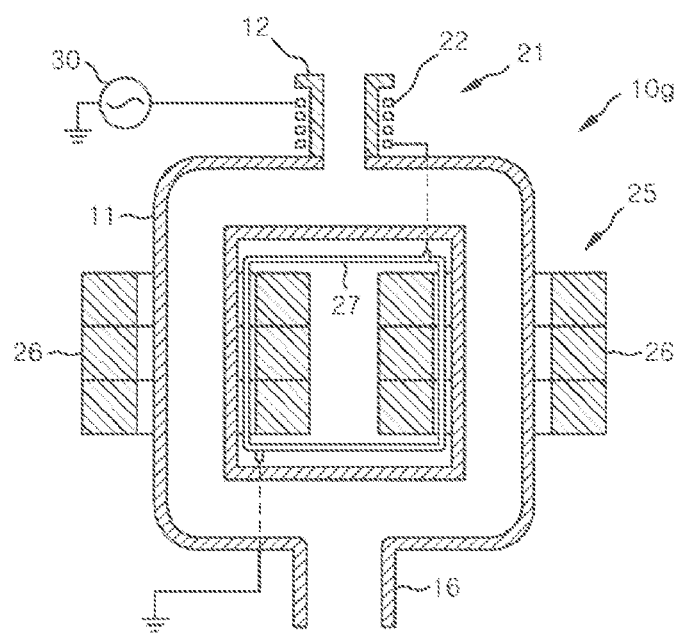
FIG. 34 is a perspective view illustrating another modified example of a hybrid plasma reactor according to the present invention.

FIG. 34 is a perspective view illustrating another modified example of a hybrid plasma reactor according to the present invention.

Referring to FIG. 34, in a hybrid plasma reactor 10g according to another modified example of the present invention, a dielectric window is installed at a gas inlet 12, or the gas inlet 12 is entirely constructed of dielectric and an inductive antenna 22 is installed there. In that case, it is possible to make an initial plasma ignition to gas input through the gas inlet 12 easy. Although not described in detail in the drawing, in case that the reactor body 11 is constructed of a conductive member, one or more electrical insulation intervals (not shown) are included in order to prevent an eddy being formed in the reactor body 11. Since other constructions are the same as the constructions of embodiments described above, the repeated description will be omitted.

The foregoing is merely an exemplary embodiment of the hybrid plasma reactor according to the present invention, and it will be readily understood by those skilled in the art that various modifications and changes can be made thereto within the technical spirit and scope of the present invention, and the scope of the present invention shall not be limited to the described embodiment. Accordingly, the technical protective scope of the present invention shall be defined by the technical spirits of the accompanied claims. Further, those skilled in the art will appreciate that the present invention includes all modifications, equivalents, and substitutes within the scope of the spirit of the present invention defined by the accompanied claims.

What is claimed is:

1. A hybrid plasma reactor comprising: a reactor body having a plasma discharge space, a gas inlet, and a gas outlet; a hybrid plasma source including an inductive antenna inductively coupled to plasma formed in the plasma discharge space and a primary winding coil transformer coupled to the plasma and wounded in a magnetic core; wherein the reactor body comprises a dielectric window formed between the inductive antenna and the plasma discharge space and a discontinuous conductive tube ground connected to an area including the inductive antenna and an alternating switching power supply for supplying plasma generation power to the inductive antenna and the primary winding coil.

2. The hybrid plasma reactor as claimed in claim 1, wherein the reactor body comprises a dielectric window formed between the inductive antenna and the plasma discharge space.

3. The hybrid plasma reactor as claimed in claim 2, comprising a vacuum insulation member formed between the dielectric window and the reactor body.

4. The hybrid plasma reactor as claimed in claim 2, wherein the plasma discharge space has a ring-shaped plasma discharge path defined by the reactor body and the dielectric window.

5. The hybrid plasma reactor as claimed in claim 1, wherein the plasma is initially ignited through inductively coupled discharge by the inductive antenna.

6. The hybrid plasma reactor as claimed in claim 1, wherein when the plasma discharge space is in a first pressure state, the plasma is maintained by plasma discharge inductively coupled by the inductive antenna, and
when the plasma discharge space is in a second pressure state higher than the first pressure state, the plasma is maintained by the plasma discharge inductively coupled by the inductive antenna and plasma discharge transformer coupled by the primary winding coil.

7. The hybrid plasma reactor as claimed in claim 1, wherein when the plasma discharge space is in a first pressure state, the plasma is maintained by plasma discharge inductively coupled by the inductive antenna, and
when the plasma discharge space is in a second pressure state higher than the first pressure state, the plasma is maintained by plasma discharge transformer coupled by the primary winding coil.

8. The hybrid plasma reactor as claimed in claim 1, wherein the inductive antenna and the primary winding coil are series connected to the alternating switching power supply.

9. The hybrid plasma reactor as claimed in claim 1, wherein the inductive antenna and the primary winding coil are parallel connected to the alternating switching power supply.

10. The hybrid plasma reactor as claimed in claim 1, wherein the reactor body is electrically ground connected.

11. The hybrid plasma reactor as claimed in claim 10, further comprising a switching circuit for selectively ground connecting the reactor body.

12. The hybrid plasma reactor as claimed in claim 1, wherein the hybrid plasma source comprises a secondary winding coil wound in the magnetic core and the inductive antenna includes two divided inductive antennas, and
one antenna of the two divided inductive antennas is connected to one end of the secondary winding coil and another antenna is connected to an opposite end of the secondary winding coil.

13. The hybrid plasma reactor as claimed in claim 12, comprising a switching circuit for selectively ground connecting the two divided inductive antennas.

14. The hybrid plasma reactor as claimed in claim 1, wherein the discontinuous conductive tube is formed between the inductive antenna and the plasma discharge space or between the dielectric window and the plasma discharge space.

15. The hybrid plasma reactor as claimed in claim 1, comprising a switching circuit for selectively ground connecting the discontinuous conductive tube.

16. The Hybrid plasma reactor as claimed in claim 1, wherein the inductive antenna is wound at the gas inlet.

* * * * *